United States Patent [19]

Robinson

[11] Patent Number: 4,745,395
[45] Date of Patent: May 17, 1988

[54] PRECISION CURRENT RECTIFIER FOR RECTIFYING INPUT CURRENT

[75] Inventor: Jeffrey I. Robinson, New Fairfield, Conn.

[73] Assignee: General Datacomm, Inc., Middlebury, Conn.

[21] Appl. No.: 7,714

[22] Filed: Jan. 28, 1987

Related U.S. Application Data

[62] Division of Ser. No. 822,396, Jan. 27, 1986.

[51] Int. Cl.$^4$ ............................................. H03M 1/44
[52] U.S. Cl. .............................. 340/347 AD; 307/270; 307/288; 323/315; 340/347 M; 363/127
[58] Field of Search ................................ 307/270, 288; 340/347 AD, 347 SH, 347 M, 347 NJ; 323/315, 316; 363/127; 330/288

[56] References Cited

U.S. PATENT DOCUMENTS 4,445,053  4/1984  Jaeger et al. ................... 328/144 X
4,495,425  1/1985  McKenzie ........................ 323/315 X

OTHER PUBLICATIONS

Dewitt et al, Transistor Electronics, McGraw-Hill Book Company, Inc., 1957, pp. 200-203.

*Primary Examiner*—T. J. Sloyan
*Attorney, Agent, or Firm*—David P. Gordon

[57] ABSTRACT

A current rectifier is provided and generally comprises: a p-channel transistor and an n-channel transistor having common gates connected to ground and common sources connected to an input current $I_{in}$; and a first current mirror with its input connected to the drain of the n-channel transistor, and its output connected to the drain of the p-channel transistor. The current rectifier preferably also includes a second current mirror with the drain of the p-channel transistor as an input to the second current mirror and the rectified output current $I_{out}$ as an output of the second current mirror. If an offset to the rectified current is desired, a third current mirror having a bias or offset current as an input and the output of the second current mirror as an output may be included.

4 Claims, 2 Drawing Sheets

PRECISION CURRENT RECTIFIER FOR RECTIFYING INPUT CURRENT

A divisional of U.S. application Ser. No. 822,396 filed Jan. 27, 1986, which is hereby incorporated by reference herein.

BACKGROUND

The present invention relates to an apparatus for rectifying current. The invention more particularly relates to CMOS circuitry for rectifying current in a continuous time domain.

Many current rectifiers are known in the art. One group of current rectifiers which are known to those skilled in the art utilize at least one operational amplifier, one comparator, and numerous resistors. These current rectifiers are typically used in switching networks where the relative reacting speed is not critical. Another set of current rectifiers known to those skilled in the art are those rectifiers using diodes. While the simplest diode current rectifiers do not account for the forward voltage drop across the diode, other arrangements known in the art have accounted for the same. However, diodes are not advantageously used in CMOS circuitry because of the resulting creation of parasitic vertical pnp transistors. Thus, it will be appreciated that the current rectifiers known in the art typically suffer from one or more of the inability to work in a continuous time domain; the inability to be integrated into a CMOS design; and the requirement of many components.

SUMMARY OF THE INVENTION

It is a therefore an object of the invention to provide an extremely fast current rectifier which may be implemented exclusively in CMOS transistors.

It is a further object of the invention to provide a current rectifier which may be realized with a minimum number of components.

It is yet a further object of the invention to provide a current rectifier for a continuous parallel successive rectification analog to digital converter using current steering techniques for extremely fast high resolution analog to digital conversion.

In accord with the objects of the invention, one embodiment of the current rectifier comprises:

(a) a p-channel transistor and an n-channel transistor having common gates connected to ground and common sources connected to an input current $I_{in}$; and (b) a first current mirror with its input connected to the drain of the n-channel transistor, and its output connected to at least the drain of the p-channel transistor.

Preferably, the current rectifier further comprises a second current mirror with the drain of the p-channel transistor as an input and the rectified output current $I_{out}$ as an output.

According to another aspect of the invention which is particularly seen where the rectifier invention is used in an A/D converter, a bias current may be introduced to offset the output current of the current rectifier by introducing a third current mirror with the bias current as an input and the output of the second current mirror as an output.

Since an analog voltage is often supplied as an input rather than a current, the current rectifier of the invention typically requires the use of transconductance amplifier to provide an $I_{in}$ and from a $V_{in}$.

A better understanding of the invention, and additional advantages and objects of the invention will become apparent to those skilled in the art upon reference to the detailed description and the accompanying drawings.

DETAILED DESCRIPTION OF THE PREFERRED EMBODIMENTS

Figure 1:
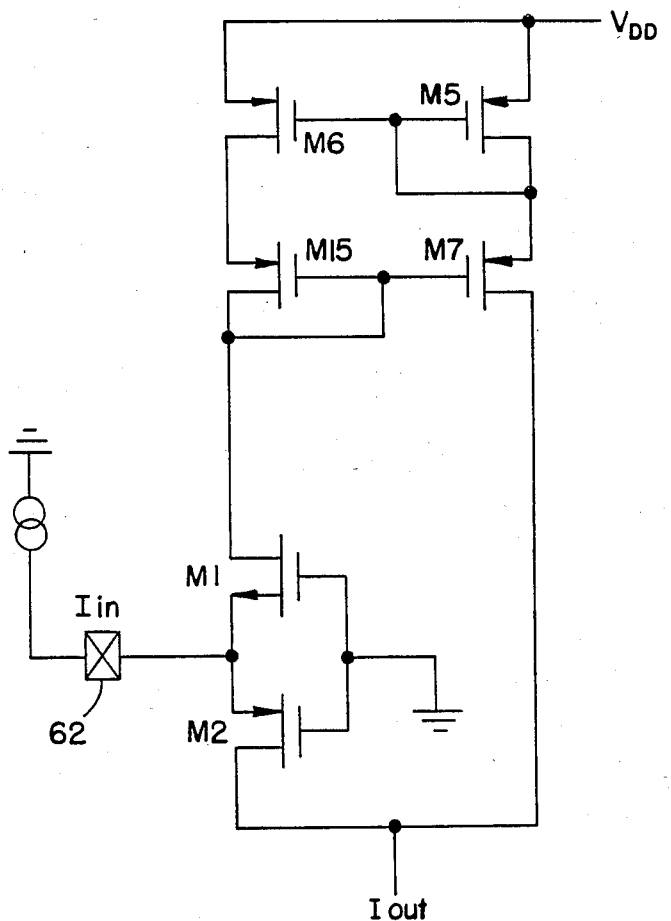
FIG. 1 is a schematic diagram of an embodiment of the current rectifier of the invention.
Figure 3:
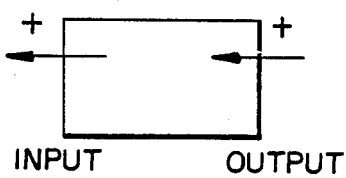
FIG. 3 is a diagram defining the direction and polarity of current flow for the circuits of FIGS. 1 and 2.

Turning to FIG. 1, one embodiment of the current rectifier of the invention is seen. FIG. 1 should be understood with reference to FIG. 3 which defines the direction and polarity of current flow. Thus, a current flow out of the input will be considered to be a positive current (providing a negative voltage), while a current flow into the output will also be considered a positive current. As seen in FIG. 1, the current rectifier 10 basically includes: a complementary transistor pair (n-channel FET M1 and p-channel FET M2) having common gates connected to ground, and common sources connected to the input current $I_{in}$; and a current mirror 70 with its input connected to the drain of the n-channel transistor M1, and its output connected to the drain of the p-channel transistor M2.

In operation, it will be seen that regardless of the direction of the current flow of current at $I_{in}$ 62, a current of the identical magnitude will always flow (negatively) out of the current rectifier from the drain of FET M2. Thus, if the current is flowing positively from $I_{in}$ 62 (out of current rectifier 10 towards the current source), the current must necessarily be coming from FETs M6, M15, and M1, as FET M2 will not permit current to flow through it in such a direction. As a result of the current flowing through FETs M6 and M15, an equal current flows through FETs M5 and M7, as FETs M5 and M7 complete the first current mirror 70. Because the drain of FET M7 is connected to the drain of FET M2, it is seen that the current leaving the current rectifier 10 at the drain of FET M2 has a magnitude of $I_{in}$ and flows negatively as defined by FIG. 3. On the other hand, if the current is flowing negatively from $I_{in}$ 62 into the current rectifier 10, the current is steered into FET M2 as the n-channel FET M1 will block a flow of current in that direction. With such an arrangement, the current flows through FET M2 and provides a current at the drain of FET M2 having the identical magnitude $I_{in}$ with a negative flow as defined by FIG. 3. Thus, regardless of the direction (signal) of the current flow at the input into the current rectifier, the output of the current rectifier 10 is always negative.

Figure 2:
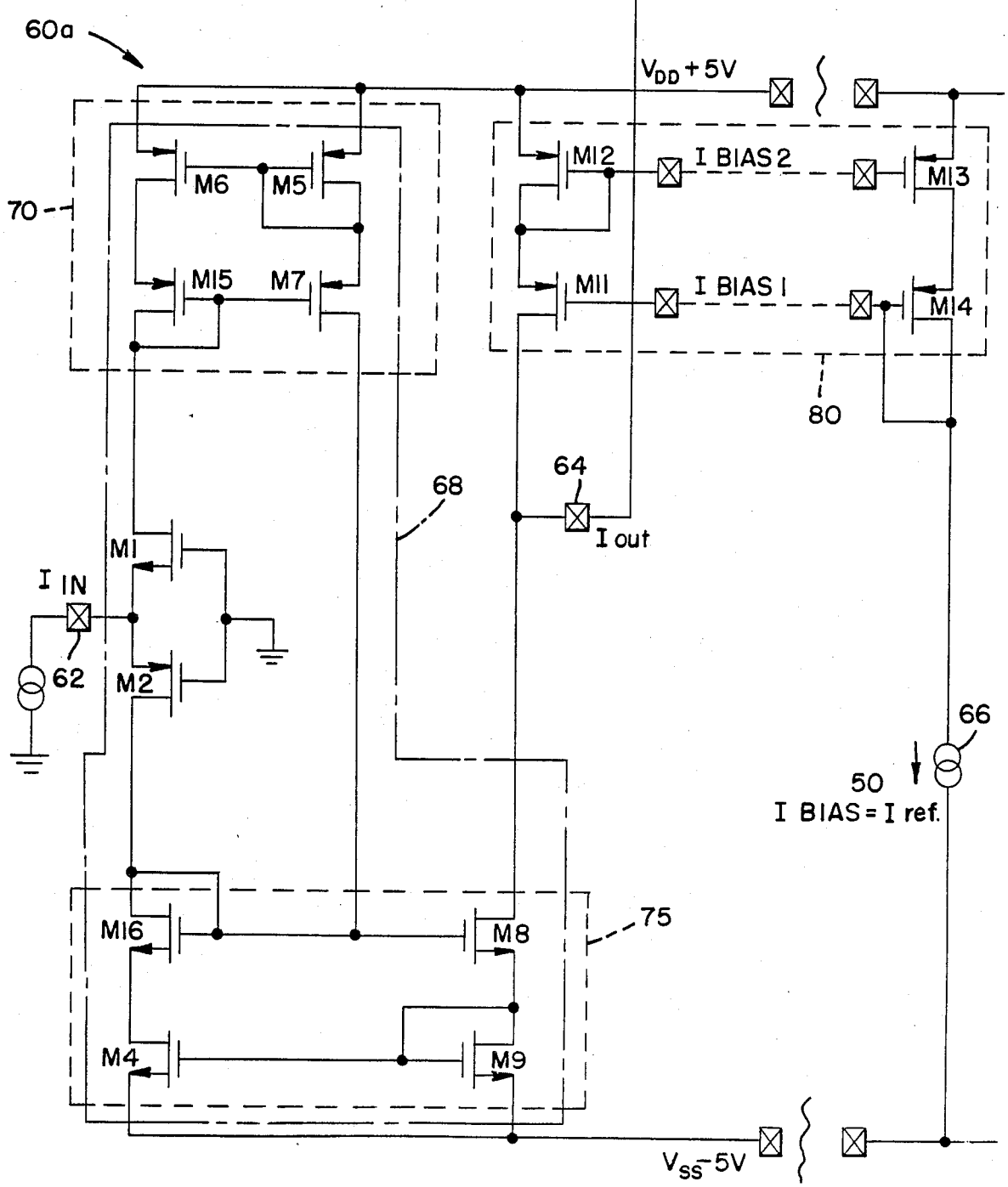
FIG. 2 is a part block diagram part schematic of a parallel continuous successive rectification analog to digital converter using an embodiment of the current rectifier of the invention.

In FIG. 2, (which likewise should be understood with reference to FIG. 3) another embodiment of the current rectifier is shown in its advantageous use in a continuous time successive rectification A-D converter. The continuous time analog to digital converter implements the successive rectification algorithm of the art, except that voltages are changed into currents. Thus, a plurality of stages 60a, 60b, . . . for performing the conversion algorithm $I_{out}=2|I_{in}|-I_{ref}$ are provided wherein $I_{in}$ 62 is the current at the input of a particular stage, $I_{out}$ 64 is the current at the output of that stage which becomes the $I_{in}$ of the next stage, and $I_{ref}$ 66 is a chosen reference current.

In order to provide a rectified input current for the A/D converter, a current rectifier 68 is provided and essentially comprises: a complementary transistor pair having an n-channel FET M1 and a p-channel FET M2 with common gates connected to ground, common sources connected to the source of $I_{in}$ 62; a first current mirror 70 having p-channel FETs M6, M15, M5 and M7, with the input connected to the drain of said p-channel FET M1, and the output connected to at least the drain of said n-channel FET M2; and a second FET current mirror 75 having n-channel FETs M16, M4, M8, and M9, with the drain of p-channel FET M2 as the input, and current flowing from $I_{out}$ 64 as the output. Those skilled in the art will appreciate that this arrangement provides an offset-free current rectifier.

The amplification of the $I_{in}$ current by a factor of two is accomplished in the second FET current mirror 75 by having the widths of the mirror FETs M8 and M9 being twice the widths of their corresponding FETs M16 and M4.

A third FET current mirror 80 comprising p-channel FETs M11, M12, M13, and M14 is used to complete the above-stated conversion algorithm by subtracting the $I_{ref}$ current 66 from $I_{out}$ 64. Thus, $I_{ref}$ 66 (which may be derived by processing $V_{ref}$ with a transconductance amplifier) serves as the current mirror input and is connected to the drain of FET M14. In turn a mirror current is provided at the drain of FET M11, and that output is connected to $I_{out}$ 64. (Indeed, it should be recognized by those skilled in the art that the use of a third current mirror in this manner permits the current rectifier to have an offset or bias current). With the current rectifier, amplifier, and subtractor so arranged, the input current is processed and leaves stage 60a according to the algorithm $I_{out}=2|I_{in}|-I_{ref}$. The output of one stage becomes the input to the successive stage.

In the operation of the analog to digital converter which uses the current rectifier invention, a first bit of information is derived from the direction of the flow of current $I_{in}$ 62. If current is flowing out (positive flow) of the circuitry toward the current source (transconductance amplifier), the provided voltage may be assumed to be negative as the gate of M1 is at ground. Current flowing into stage 60a (negative flow) may be considered evidence of a positive voltage. With the sources of FETs M6, M5, and M12 at a positive supply potential, and the sources of FETs M4 and M9 at a negative supply potential, if the current is flowing negatively at stage 60a, it must necessarily follow a path through FETs M2, M16, and M4, as FET M1 will not allow current to flow through it in that direction. As a result of that flow, FETs M8 and M9, which complete the second current mirror 75, provide a twin current which mirrors FETs M16 and M4. However, because FETs M8 and M9 are arranged to have twice the widths of FETs M16 and M4, the current flowing through FETs M8 and M9 is twice that of the current $I_{in}$ flowing through FETs M16 and M4.

If the current is flowing positively (out of) at stage 60a, the current must necessarily be coming from FETs M6, M15, and M1, as FET M2 will not permit current to flow through it in such a direction. As a result of the current flowing through FETs M6 and M15, an equal current flows through FETs M5 and M7, as FETs M5 and M7 complete the first current mirror 70. Current leaving the drain of FET M7 continues through the drain of FET M16 because of the gate-drain short of FET M16 and then continues through FET M4. The flow of current through FETs M16 and M4 cause a flow through FETs M8 and M9 of twice the $I_{in}$ current, as previously described, because FETs M8 and M9 complete second current mirror 75 and because FETs M8 and M9 are twice the width of FETs M16 and M4. Thus, it is seen that the combination of the complementary transistor pair M1 and M2 with first current mirror 70 and second current mirror 75, acts to rectify the current signal, as the current magnitude dictated by $I_{in}$ will always flow in the same direction through FETs M8 and M9. Because the current is "supplied" by $I_{out}$, the current due to $2|V_{in}|$ will always flow positively from the input of stage 60b, and will always be positively rectified. It is also seen that the input current signal may be amplified by a factor of two by causing the transistors on the mirror side of the second current mirror 75 to be twice the width of the corresponding transistors on the input side.

The operation of the final aspect of the successive rectification algorithm is seen by referring to $I_{ref}$ 66 and third current mirror 80. By choosing $I_{ref}$ to be a current in a defined direction, the $I_{ref}$ current is forced to flow down through FETs M13 and M14. The current flow through FETs M13 and M14 causes an identical current to flow through FETs M12 and M11, the mirror FETs of current mirror 80. Thus, current $I_{ref}$, by definition, flows negatively at $I_{out}$, in the opposite direction of the current ($2|I_{in}|$) flowing through FETs M8 and M9, and completes the operation. As the $I_{out}$ of stage 60a is the $I_{in}$ of stage 60b, a second bit of information may be determined by determining the direction of the flow of current at the input to stage 60b. Indeed, as aforementioned, if the current is flowing out of stage 60b (positive flow), the voltage will be measured as a negative voltage as the gate of the M1 FET of stage 60b is at ground. Conversely, current flowing into stage 60b will be provided a positive voltage measurement.

The input into the first stage, and the output of the stages of the A-D converter provides information in a Gray code. The Gray code may be converted into binary information by processing it through exclusive NOR gates as discussed in parent patent application Ser. No. 822,396.

Those skilled in the art will appreciate that the continuous parallel successive rectification A-D converter using the current rectifier of the invention is extremely fast in providing as many bits of resolution as is required because it uses current steering techniques. Indeed, it is aptly described as a continuous converter as no switches are required for timing. It is also extremely energy efficient as the FETs of the embodiment use very little power. Thus, a continuous time parallel successive rectification A-D converter using the current rectifier invention and modelled according to the other teachings herein was able to provide six bits of resolution in 290 nanoseconds, and twelve bits of resolution in 580 nanoseconds. The wattage per stage was approximately 0.5 milliwatts. However, the transconductance amplifiers used to convert the reference and sampled voltages into currents utilized 192 milliwatts. it should be recognized that such an overall performance permits the realization of the current rectifier invention as well as the A-D converter in microchips and integrated circuits, and permits the employment of the current rectifier and A-D converter in a wide range of devices.

There has been described and illustrated herein a current rectifier as well as a continuous time analog to digital converter which utilizes one embodiment of the current rectifier. While particular embodiments of the invention have been described, it is not intended that the invention be limited thereby, as it is intended that the invention be broad in scope and that the specifications be read likewise. For example, while the current rectifier was described as using at least one current mirror, with each current mirror having four transistors, different current mirrors using two, three, or other amounts of transistors could be effectively used.

It should also be recognized that the current rectifier of the invention may be realized in many different forms. For example, discrete components may be used for each of the described devices. Or, if desired, the components may be partially or fully integrated into an integrated circuit. Finally, if desired, equivalent componentry may be substituted with only minor resulting changes in the designs and results. Thus, for example, the MOSFETs used and described could be replaced by bipolar transistors and resistors, if desired, and it is intended that the invention encompass such minor changes. Indeed, it is intended that the terminology relating to the transistors be used in a broad sense, with "source" being generic for a source or emitter, "gate" being generic for a gate or base, etc. Therefore, it will be apparent to those skilled in the art that other changes and modifications may be made to the invention as described in the specification without departing from the spirit and scope of the invention as claimed.

I claim:

1. An apparatus for rectifying an input current, comprising:
    (a) a p-channel transistor and an n-channel transistor having common gates connected to ground and common sources connected to an input current $I_{in}$;
    (b) a first current mirror with its input connected to the drain of said n-channel transistor, and its output connected to the drain of said p-channel transistor;
    (c) a second current mirror with the drain of said p-channel transistor as an input and a rectified output current $I_{out}$ as an output; and
    (d) a third current mirror having a bias current $I_{ref}$ as an input and the output of said second current mirror as an output, wherein the rectified output current is thereby offset and equals $I_{out} - I_{ref}$.

2. An apparatus according to claim 1, wherein:
    said first and second current mirrors each comprise a four transistor CMOS current mirror.

3. An apparatus according to claim 1, wherein:
    said first, second, and third current mirrors each comprise a four transistor CMOS current mirror.

4. In an apparatus for the analog to digital conversion of a signal having a plurality of stages for performing the conversion algorithm $I_{out} = 2|I_{in}| - I_{ref}$, wherein $I_{in}$ is the current at the input of a particular stage, $I_{out}$ is the current at the output of that stage which becomes the $I_{in}$ to the next stage, and $I_{ref}$ is a chosen reference current, each stage comprising a current rectifier, and a first current mirror having said $I_{ref}$ as an input and said $I_{out}$ as an output,
    wherein a bit of information is obtained from the direction of the current flow of each $I_{in}$, the bit obtained from each stage together forming a Gray code output word, a current rectifier, comprising:
    (a) a p-channel transistor and an n-channel transistor having common gates connected to ground and common sources connected to an input current $I_{in}$;
    (b) a second current mirror with its input connected to the drain of said n-channel transistor, and its output connected to the drain of said p-channel transistor; and
    (c) a third current mirror with the drain of said p-channel transistor as an input and the rectified output current $I_{out}$ as an output, wherein said third current mirror has at least one transistor on its input side and at least one transistor on its output side, and the transistors on the output side of said third current mirror are twice the width of the corresponding transistors on the input side of said current mirror, to provide a rectified gain of two.

* * * * *